TIN AS A DOPANT IN GALLIUM ARSENIDE CRYSTALS

Filed Jan. 20, 1960

DONALD P. MILLER
*INVENTOR.*

BY James O. Dixon

United States Patent Office 3,391,308
Patented July 2, 1968

3,391,308

TIN AS A DOPANT IN GALLIUM ARSENIDE CRYSTALS

Donald P. Miller, Dallas, Tex., assignor to Texas Instruments Incorporated, Dallas, Tex., a corporation of Delaware Filed Jan. 20, 1960, Ser. No. 3,679
17 Claims. (Cl. 317—235)

ABSTRACT OF THE DISCLOSURE

Disclosed are compound gallium arsenide materials containing donor impurities selected from the group consisting of tin, germanium and silicon. Disclosed also are gallium arsenside semiconductor devices such as transistors and diodes wherein at least one PN junction is formed by a region of strongly P-type gallium arsenside material and a region of strongly N-type gallium arsenide, the doping impurity of the N-type region being tin.

Figure 1A:
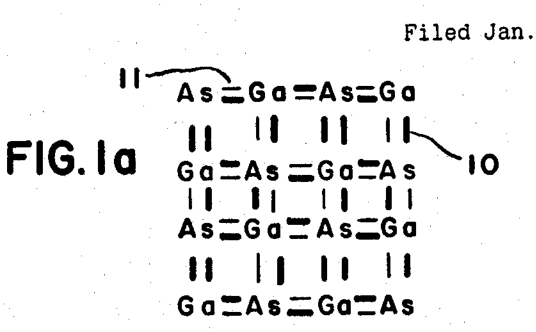

This invention relates to novel semiconductor materials, to devices made therefrom, and the methods for making said devices.

More particularly, the present invention relates to gallium arsenide compound semiconductor materials and to a novel method for producing N-type conductivity and PN junctions therein through the use of tin and other materials.

Semiconductor materials have come into prominence recently because of their usefulness in making such devices as transistors, diodes, rectifiers, photoelectric devices, and thermoelectric devices among others.

Certain elements of Group IV*a* of the periodic table of elements, i.e., carbon, silicon, germanium and tin, have in common the characteristics requisite for semiconductor materials. (As used herein, the periodic table of elements shall mean that table according to Mendelejeff as now generally portrayed.) However, because of the difficulty of synthetic production of the diamond form of carbon and the instability of the diamond lattice in tin, the semiconductor materials first used and now most commonly used in devices of the type mentioned above are germanium and silicon.

Nevertheless, because of certain inherent limitations of germanium and silicon as semiconductor materials and because of the difficulties of producing and maintaining the diamond lattice structure in tin and carbon, experimenters have been diligently searching for other and better semiconductor materials. The so-called compound semiconductor materials which are comprised of an element from Group III*a* and an element from Group V*a* of the periodic table as disclosed in U.S. Patent No. 2,798,989 to Welker, appear superior to the Group IV*a* semiconductors in many of their characteristics.

Among the properties affecting the usefulness of a material as a semiconductor are its forbidden energy gap, its minority carrier mobility and lifetime, and its crystal lattice structure.

Semiconductor materials are characterized by discrete electron energy levels or bands. The electrons forming the bonds of saturable valence force acting between the immediately adjacent atoms of the cubic lattice structure do not contribute to electrical conductivity, and are said to exist in the valence band or energy level. The electrons possessing a higher energy level are said to reside in the conduction band. No electrons can possess energy at a level intermediate these two energy levels and, therefore, the gap between the valence band and the conduction band is known as the forbidden energy band or gap. This forbidden energy band varies substantially among the various semiconductor materials. For example, in germanium the forbidden energy band is about 0.75 electron volt in width. Silicon has a forbidden energy band approximately 1.1 electron volts wide. The width of the forbidden energy band of a semiconductor material is one of the factors affecting the range of temperatures over which devices made from that material are operative. Heating the semiconductor material produces thermal excitation of the electrons and will cause electrons in the valence band to obtain sufficient energy to come into the conduction band. Thus, each material ionizes sufficiently at some temperature that its semiconducting properties are destroyed and it becomes essentially a conductor. For this reason, germanium is useful only up to about 85° C., and silicon only to approximately 200° C.

The electron or "carrier" mobility in a semiconductor material is a factor greatly affecting the frequency response of any devices made from that material and the physical parameters, such as base width, required in such devices to make them operable. As the carrier mobility increases, the frequency response of the semiconductor device also increases. Thus, germanium with an electron mobility of approximately three times that of silicon, provides a much greater frequency response in devices made from it than is obtainable in devices made from silicon. Hence, although semiconductor devices of silicon may operate at higher temperatures than those of germanium, the frequency response of the silicon devices is somewhat limited as compared with that of germanium.

The lifetime of minority carriers in a semiconductor material, which is a function of the number of carriers available and their mobility within the crystal, is a factor also affecting the electrical parameters of any device made from the material. In certain types of devices, the lifetime is desired as low as possible; in others, a higher lifetime is required.

Because extremely pure semiconductor materials have very few electrons in the conduction band (within their usable temperature range) and are essentially insulators, carriers in the form of either electrons as negative carriers or holes, as positive carriers, with energies in or near the conduction band must be povided in the semiconductor material for the fabrication of workable devices. These additional carriers are provided by minute amounts of impurities in the material. The type and number of carriers provided is determined by the particular impurity and the amount added. In germanium and silicon, N-type or donor impurities—those producing excess electron carriers—are selected from the elements of Group V*a* of the periodic table, usually phosphorus, arsenic and antimony, and P-type or acceptor impurities—those producing hole carriers—are selected from Group III*a* of the periodic table, usually boron, aluminum, gallium or indium. When an atom of a Group V*a* impurity, which has five electrons in its outer shell, is substituted for an atom of germanium or silicon, which have four electrons in their outer shells, four of the electrons in the impurity atoms enter into the bonds with adjacent germanium or silicon atoms, leaving an extra carrier electron. In the same manner, substitution of an atom of a Group III*a* impurity (three valence electrons) for a germanium or silicon atom leaves an electron deficiency or hole.

Because of the possibility of the wider range of selection and different combinations of the various characteristics mentioned above, the III*a*–V*a* compounds offer many advantages over germanium and silicon as semiconductors. For example, various combinations of Group III*a* and Group V*a* elements offer energy gaps ranging from 0.45 electron volt to 1.6 electron volts and carrier mobilities up to twenty times that of silicon.

Of the Group III*a*–V*a* semiconductor compounds, gallium arsenide apparently has the greatest potential as a semiconductor material. Its forbidden energy band is near that of silicon (1.35 electron volts) and its carrier mobility is very nearly that of germanium. Thus, gallium arsenide semiconductor devices will have very good high frequency response, and will be operative up to temperatures of about 400° C.

Despite the inherent advantages of gallium arsenide and others of the compound semiconductors, certain difficulties have prevented their use in semiconductor devices to any important degree, as yet. Among these are the difficulties of producing a material of the requisite purity, and the difficulties of adding required amounts of significant inpurities or "dopes" to the material to produce the P- and N-type regions required in useful devices. The significant P-type impurities (Group III*a* elements, boron, aluminum, gallium and indium) and the significant N-type impurities (Group V*a* elements, phosphorus, arsenic, and antimony) used with the Group IV*a* semiconductor materials of silicon and germanium are relatively easy to control in the various growing, alloying and diffusion processes used in the fabrication of devices. Although the P-type significant impurities (acceptors) of Group II*a* of the Periodic Table for the III*a*–V*a* compound semiconductor materials have proved manageable, the N-type impurities (donors) of Group VI*a* of the Periodic Table have proved quite difficult to handle because of their high vapor pressures. This has been especially true in connection with gallium arsenide wherein one of the elements of the compound is much more volatile than the other and the compound tends to dissociate at the temperatures required for diffusion or alloying of Group VI*a* elements. For this reason, there have been intensive investigations directed toward finding other materials suitable as N-type dopes for gallium arsenide. Because the properties of elements of Group IV make them more manageable, investigations were launched in hopes that these elements might prove suitable as dopes, either N- or P-type, depending on which element of the III*a*–V*a* compound had some of its atoms replaced by atoms of the Group IV*a* element in the crystal. However, reports from these investigations indicate that the Group IV*a* elements of silicon, germainum and tin substitute in gallium arsenide in "nearest neighbor pairs," i.e., two atoms of the Group IV*a* element replace one atom of the Group III*a* element and an adjacent atom of the Group V*a* element (its nearest neighbor), with a result that the material remains electrically neutral.

Contrary to the teachings of the prior art, it has been discovered that certain Group IV*a* elements will enter gallium arsenide as N-type impurities, and particularly, that tin will produce excellent results as a donor impurity in gallium arsenide. The unexpected properties of N-type gallium arsenide obtained from doping with tin make this material especially suitable for the fabrication of transistors, diodes, and a relatively new semiconductor device known as the tunnel diode, now attracting wide attention.

The tunnel diode is a single crystal semiconductor device having a single, very sharp PN junction with the material on either side of the junction "doped" to degeneracy, i.e., containing relatively extreme large amounts of donor or acceptor impurities. The tunnel diode exhibits a current-voltage characteristic with a negative resistance region which is quite large, and thus is useful as an oscillator and as an amplifier. The unique qualities of the tunnel diode make it superior to transistors and other devices for many applications. Among these qualities are good high frequency response, low input power requirements, low noise figure, and the ability to withstand environmental extremes. The tunnel diode, however, is a very recent development and, therefore, is not yet in widespread use. Most of these devices so far reported have been made from germanium material. The present invention offers a means of combining the superior device qualities of the tunnel diode with the advantages of gallium arsenide as a semiconductor material in a novel and exceptionally high quality device through the use of the strong donor doping action of tin in gallium arsenide.

It is therefore a primary object of the present invention to provide a means for forming PN junctions in P-type gallium arsenide semiconductor material by the use of the Group IV*a* element tin.

It is a further object of this invention to provide improved semiconductor devices through the use of tin doped gallium arsenide.

It is a still further object of the present invention to provide an improved tunnel diode semiconductor device having enhanced characteristics by reason of the use of tin-doped gallium arsenide therein.

Figure 2:
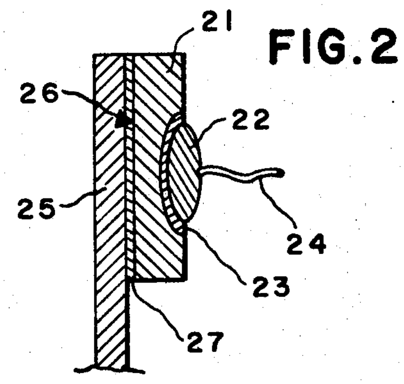
Figure 3A:
Figure 3B:
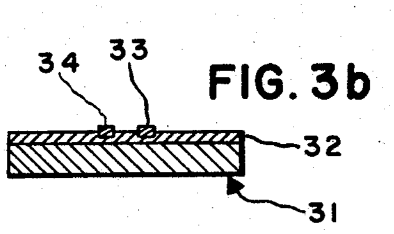
Figure 3C:
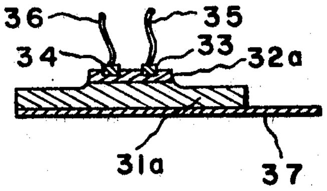
Figure 4:
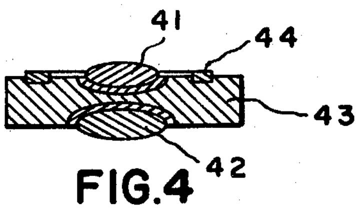

Further objects and advantages of the present invention will become apparent from the following detailed description taken in conjunction with the drawings in which:

FIGURES 1*a* through *e* are a schematic representation of the crystal lattice structure of gallium arsenide, showing the action of donor and acceptor impurities;

FIGURE 2 illustrates a gallium arsenide tunnel diode element made according to the present invention;

FIGURES 3*a* through *c* illustrate the steps in the fabrication of a gallium arsenide diffused base transistor according to the present invention; and FIGURE 4 illustrates a gallium arsenide alloy transistor element made according to the present invention.

Figure 1B:
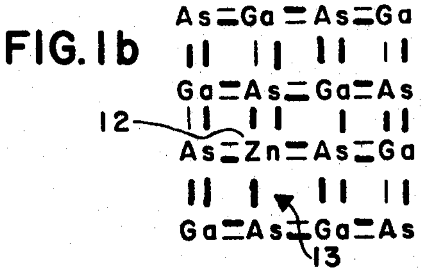
Figure 1C:
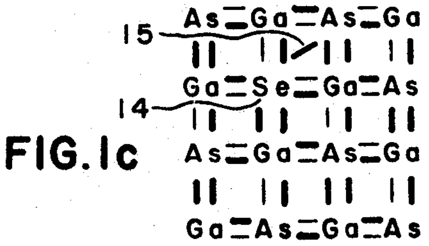

Turning now to FIGURE 1*a*, there is illustrated schematically the crystal lattice structure of the III*a*–V*a* semiconductor compound, gallium arsenide. It is to be remembered that this is only a two dimensional expression of a three-dimensional structure. The crystal lattice of a compound semiconductor is quite similar to the diamond crystal lattice of a Group IV*a* semiconductor wherein double bonds are formed between each atom of the material with each atom contributing four electrons to the bonds. Thus, each atom shares two electrons with each adjacent atom. In the compound semiconductor crystal, which is of the zinc blende structure, double bonds are also formed between each atom. However, this crystal lattice differs in that each atom of the Group III*a* element, gallium in the figure, contributes only three electrons as indicated by the heavy lines 10 and each atom of the Group V*a* element contributes five electrons as indicated by the lighter lines 11. As illustrated in FIGURE 1*b*, the compound may be caused to have P-type conductivity (excess holes) by substituting atoms of some Group II*a* element 12, such as zinc, for some gallium atoms. Since zinc has only two valence electrons, its inclusion in the lattice produces an electron deficiency (hole 13). An N-type conductivity structure will be produced if Group VI*a* element atoms 14, such as selenium, are substituted for some of the arsenic atoms, as illustrated in FIGURE 1*c*. Since Group VI*a* elements have six valence electrons, as compared to five in arsenic, one electron 15, in excess of the number required to produce all of the double bonds, is present in the lattice. Materials producing N-type conductivity are called donors, and those producing P-type conductivity are called acceptors.

Figure 1D:
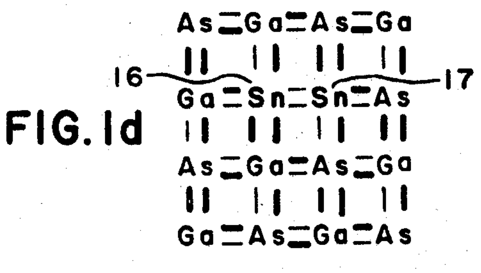

It might seem logical to substitute Group IV*a* atoms (four valence electrons) in the lattice to act either as a donor if it replaced the gallium atom—three valence electrons—or as an acceptor if it replaced an arsenic atom—five valence electrons. Indeed, this type of doping was investigated. Prior art reports, however, state that the Group IV*a* elements of tin, germanium, and silicon act neither as donors nor acceptors in III*a*–V*a* compounds and explain that these Group IV*a* atoms substitute in the lattice for nearest neighbor pairs as schematically illustrated in FIGURE 1*d*. One atom 16 of tin—a Group IV*a* element—has substituted for one atom of arsenic and one atom 17 of tin has substituted for an adjacent gallium atom. Thus, two atoms, each with four valence electrons, have been substituted for two atoms, one having three valence electrons and the other having five valence electrons, a total of eight valence electrons. Therefore, no holes or excess electrons are produced. This was apparently proven in the prior art by resistivity measurements on undoped gallium arsenide and tin-doped gallium arsenide. These measurements showed almost identical resistivities in the doped and undoped gallium arsenide. Prior resistivity measurements in III*a*–V*a* compounds doped with silicon and germanium also indicate nearest neighbor pair substitution and thus no action of these elements as donors or acceptors.

Figure 1E:
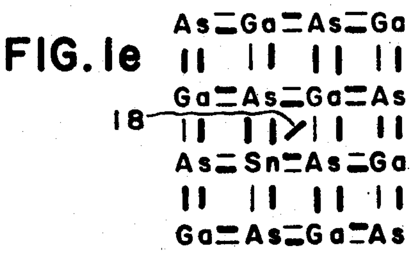

In applicant's experiments, however, it was discovered that P-type gallium arsenide, to which a tin dot had been alloyed, exhibited current rectifying characteristics indicating the presence of a PN junction produced by the conversion of a region of the gallium arsenide from P-type to N-type conductivity. From this, it was deduced that tin must enter the gallium arsenide crystals substituting for a gallium atom, as illustrated in FIGURE 1*e*, to produce an excess electron 18. Further experiments show that other elements of Group IV*a*, such as silicon and germanium, act as donor impurities in III*a*–V*a* compounds, but not nearly so strongly as does tin. The explanation seems to be that both single atom and nearest neighbor pair substitutions occur when the compound semiconductors are doped with Group IV*a* elements.

Although silicon, germanium and tin will all act as donors in gallium arsenide to some degree, tin is the preferred element for several reasons. First of all, tin has the lowest melting point of these three elements and, therefore, is more easily alloyed to the III*a*–V*a* compounds. Secondly, tin is more soluble in the gallium arsenide than are germanium and silicon. Thirdly, tin is a stronger donor impurity than the other two elements, probably because it enters the semiconductor substituting for nearest neighbor pairs only to a slight degree as compared with silicon and germanium.

The strong doping properties of tin in gallium arsenide make it an excellent material for use in forming the emitter of gallium arsenide transistors and in forming the N-type region of gallium arsenide tunnel diodes. Excellent gallium arsenide tunnel diodes have been made by the following simple process. A wafer of a single crystal high purity gallium arsenide, which was slightly N-type conductivity, was heavily doped—to degeneracy—to convert it to P-type conductivity. This conversion was accomplished by the diffusion of zinc throughout the wafer, but may be accomplished by other well known techniques. A tin "dot" was then placed in contact with the wafer and both were heated to approximately 700° C. in a reducing or inert atmosphere. The wafer and dot were held at this temperature for a period of about five minutes or until good contact (wetting) was established between the molten tin and the gallium arsenide wafer. It has been found that the tin will alloy to the wafer at temperatures of from 450° C. to 800° C. for times ranging from about three minutes to about ten minutes. The wafer was then cooled and leads affixed to the tin dot and the P-type region of the element. FIGURE 2 depicts the tunnel diode element produced, as described above. The strongly P-type region of the wafer is designated as 21. Immediately beneath the tin dot 22 is a region 23 of strongly N-type gallium arsenide. A lead wire 24 of copper or other suitable material is soldered to the tin dot using a suitable solder, such as ordinary tin-lead solder. The contact tab 25, which may be of copper, platinum, or other suitable material, is affixed to the P-type region 21 using a solder such as gold-zinc, silver-indium, other suitable alloys, or by nickel plating the surface 26 of the wafer and using an ordinary tin-lead or other solder to attach the tab to the plating 27. It is to be realized that the tin may be applied and alloyed to the wafer from the vapor state, using suitable evaporation equipment, and that the tin alloy region need not be confined to such a small region of the surface of the wafer.

A gallium arsenide NPN diffused base transistor may be produced using the technique illustrated in FIGURES 3*a–c*. A starting wafer 31 of N-type conductivity has diffused into its surface to a depth of a few mils a P-type conductivity impurity such as zinc to produce a P-type "skin" as shown by the dashed lines in FIGURE 3*a*. The resulting P-type gallium arsenide is then removed from all but one surface of the wafer, as by etching, leaving only the P-type region 32 beneath the one surface. Tin is then evaporated onto a small region 33 of the P-type surface, and a zinc-gold alloy is evaporated onto another small region 34 adjacent the tin. The wafer is then heated to from about 600° C. to about 800° C. for a time sufficient to alloy the tin and the zinc-gold alloy to the wafer. The wafer is then masked in an area immediately surrounding the two alloyed contacts and the unmasked P-type region removed by etching to produce a "mesa" structure (see FIGURE 3*c*) in the conventional way. After removal of the masking material, leads 35 and 36 are attached as by thermal compression bonding to the two alloyed regions, and a tab 37 is soldered to the N region of the wafer. The N-type region 31*a* of the wafer comprises the collector of the transistor and the P-type diffused region 32*a* of the mesa, the base. The zinc-gold alloy contact 34, forming an ohmic contact to the P-type region, acts as the base contact to the transistor and the tin-alloyed contact 33, forming a rectifying contact with the P-type region, acts as the emitter contact of the transistor.

A gallium arsenide NPN alloy transistor can be made by alloying tin into opposite sides of a P-type gallium arsenide wafer using the same techniques outlined above to produce the tunnel diode. Such a transistor (before the attachment of leads) is shown in FIGURE 4 wherein the tin emitter dot is designated as 41 and the tin collector dot is designated as 42. Contact to the base region—bulk of the P-type gallium arsenide wafer 43—is achieved by an alloyed silver-zinc ring 44.

It is to be recognized that tin may be diffused, rather than alloyed, into gallium arsenide to produce N-type doping. For diffusion, the gallium arsenide wafer is sealed in an evacuated ampoule of quartz or similar material, together with a small amount of tin so arranged that the tin is not in contact with the wafer. The ampoule and its contacts are then heated to from 800° C. to 1000° C. for a period of from one hour to about fifty hours.

The donor doping properties of germanium, silicon and tin, making these materials useful in the formation of rectifying contacts to P-type gallium arsenide, also make these materials excellent for the formation of ohmic contacts to N-type gallium arsenide, especially tin.

The processes outlined above for the manufacture of various gallium arsenide devices have been described omitting certain necessary etching, cleaning, and other steps, all of which are usual and conventional in the art in the production of semiconductor devices, since these particular steps form no part of the inventive concept of the present invention.

As used in this application, the phrase "doped to degeneracy" refers to that doping level in the particular semiconductor at which the Fermi level is not within the forbidden band gap.

It is to be recognized that many changes and modifications, still within the scope and spirit of the present invention, will become immediately apparent to those skilled in the art. Therefore, it is intended that the present invention be limited only as set forth in the appended claims.

What is claimed is:

1. An N-type conductivity semiconductor material comprising the compound gallium arsenide containing tin as the donor element.

2. A gallium arsenide semiconductor device containing therein an N-type region wherein the donor doping element is tin.

3. A gallium arsenide semiconductor device containing a PN junction wherein the N-type region of the device contains tin as a donor doping material.

4. In a compound semiconductor diode, a cathode comprising compound gallium arsenide containing tin as an N-type doping element.

5. A gallium arsenide tunnnel diode comprising a region of strongly P-type gallium arsenide material form a P-N junction with a region of strongly N-type gallium arsenide wherein tin is the doping impurity of said region of strongly N-type gallium arsenide.

6. A gallium arsenide tunnel diode device comprising gallium arsenide material containing zinc in an amount sufficient to dope said gallium arsenide P-type to degeneracy and forming a P-N junction with a second region of gallium arsenide material containing tin in an amount sufficient to dope said second region of gallium arsenide material N-type to degeneracy.

7. In a gallium arsenide transistor, and N-type regions of said transistor contain tin as the donor doping element.

8. An NPN gallium arsenide transistor comprising a wafer of P-type gallium arsenide having alloyed to opposite surfaces thereof dots of tin.

9. An NPN gallium arsenide transistor of the diffused base type wherein the emitter contact is comprised of tin alloyed to the P-type region of said transistor.

10. The combination comprising a body of N-type gallium arsenide and tin alloyed thereto and forming therewith an ohmic contact.

11. A tunnel diode comprising a gallium-arsenide semiconductor body of p-type conductance, and a tin electrode fusion-bonded with said body and forming an n-type fusion region together therewith.

12. A tunnel diode comprising a p-type gallium-arsenide semiconductor wafer, a barrier-free electrode fused together with said body on one side thereof and in area contact therewith, and an electrode consisting substantially all of tin and alloy-bonded to said body at the other side thereof and forming an n-type junction region together with said body.

13. A tunnel diode comprising a semiconductor body of gallium-arsenide doped with zinc and having p-type conductance, and a tin electrode fusion-bonded with said body and forming an n-type fusion region together therewith.

14. A diode comprising a gallium-arsenide semiconductor body of p-type conductance, and a tin electrode fusion-bonded with said body and forming an n-type fusion region together therewith.

15. A diode comprising a p-type gallium-arsenide semiconductor wafer, a barrier-free electrode fused together with said body on one side thereof and in area contact therewith, and an electrode consisting substantially all of tin and alloy-bonded to said body at the other side thereof and forming an n-type junction region together with said body.

16. A diode comprising a semiconductor body of gallium-arsenide doped with zinc and having p-type conductance, and a tin electrode fusion-bonded with said body and forming an n-type fusion region together therewith.

17. A diode comprising a gallium-arsenide semiconductor body of p-type conductance, a tin electrode fusion-bonded with said body and forming an n-type alloy region together therewith, and a barrier-free counter electrode area-bonded with said body and consisting of a copper-containing base plate and a tin layer between said base plate and said gallium-arsenide body.

References Cited

UNITED STATES PATENTS

| | | | |
|---|---|---|---|
| 2,798,989 | 7/1957 | Welker | 148—1.5 |
| 2,928,761 | 3/1960 | Gremmelmaier | 148—1.5 |
| 3,187,193 | 6/1965 | Rappaport et al. | 307—88.5 |

FOREIGN PATENTS

| | | |
|---|---|---|
| 1,184,921 | 2/1959 | France. |
| 1,193,194 | 4/1959 | France. |

OTHER REFERENCES

Kolm et al., "Studies on Group III–V Intermetallic Compounds" Physical Review, vol. 108, No. 4, Nov. 15, 1957, pp. 965 to 971 incl.

Properties of Elemental and Compound Semiconductors, vol. 5, 1960, Interscience Publishers Inc., New York, pp. 48–51 relied on. Copy in Sci. Library and Div. 3.

Schillmann: Z. Naturforsch. 11a, 463–72 (1956).

Sommers: Proc. of the I.R.E. 1201–6 (July 1959) copy in 148–1.5. Technical Information, Sheet Tunnel Diodes General Electric Research Laboratory, Schenectady, N.Y., July 23, 1959, 12 pages copy in 148–33.

JOHN W. HUCKERT, *Primary Examiner.*

M. LYONS, *Examiner.*

B. M. MULLIN, C. N. LOVELL, R. F. SANDLER, *Assistant Examiners.*